(12) United States Patent
Asnaashari

(10) Patent No.: US 9,786,369 B1
(45) Date of Patent: Oct. 10, 2017

(54) ENHANCED MLC PROGRAMMING

(71) Applicant: Crossbar, Inc., Santa Clara, CA (US)

(72) Inventor: Mehdi Asnaashari, Danville, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/683,292

(22) Filed: Apr. 10, 2015

(51) Int. Cl.
*G11C 13/00* (2006.01)
*G11C 11/56* (2006.01)

(52) U.S. Cl.
CPC ...... *G11C 13/0069* (2013.01); *G11C 11/5614* (2013.01); *G11C 13/004* (2013.01); *G11C 13/0097* (2013.01)

(58) Field of Classification Search
None
See application file for complete search history.

(56) References Cited

U.S. PATENT DOCUMENTS

| 9,171,617 | B1* | 10/2015 | Park | G11C 13/0069 |
| 2003/0123277 | A1* | 7/2003 | Lowrey | G11C 11/56 365/148 |
| 2009/0258489 | A1* | 10/2009 | Chen | H01L 27/101 438/652 |
| 2010/0067290 | A1* | 3/2010 | Savransky | G11C 13/0004 365/163 |
| 2010/0238701 | A1* | 9/2010 | Tsukamoto | G11C 11/5685 365/148 |

\* cited by examiner

*Primary Examiner* — James G Norman
(74) *Attorney, Agent, or Firm* — Amin, Turocy & Watson, LLP

(57) ABSTRACT

Mechanisms or techniques for improving operations such as program or erase operations that are intended to set a state of one or more multi-level memory cells (MLC) to a selected or designated state. For example, a first voltage pulse can be applied to an MLC that is intended to set the MLC to a desired state. Thereafter, a sensing pulse can be applied to the MLC, and one or more suitable electrical characteristic (EC) such as resistance can be measured and reported. This measured EC can then be compared to thresholds that define the range of acceptable values for the EC in order for the MLC to be deemed to be in the selected state. If the measured EC is not within the suitable range threshold, then one or more additional voltage pulses can be applied in order to properly set the MLC to the designated state and these additional voltages pulses can have different characteristics than the first voltage pulse.

27 Claims, 14 Drawing Sheets

US 9,786,369 B1

ENHANCED MLC PROGRAMMING

TECHNICAL FIELD

This disclosure generally relates to improved techniques in connection with setting a multi-level cell (MLC) memory to a desired state, for example when programming or erasing the MLC memory.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for enhanced program, erase, or other operations that set multi-level cell (MLC) memory to a designated state. Systems and methods disclosed herein relate to a memory device. The memory device can comprise a controller, a program and erase voltage generation (PEVG) component, a verification component, and an electrical characteristics (EC) table or store.

The controller can interface to an array of memory comprising an MLC characterized by a set of distinct states of the MLC that, respectively, represent multiple bits of information. The PEVG component can apply to the MLC a first voltage pulse for a first duration and/or with a first voltage magnitude, wherein the first voltage pulse is configured to set the MLC to a designated state of the set of distinct states. The verification component can receive sensing feedback in response to a sensing pulse applied to the MLC, compare the sensing feedback to threshold data (e.g., received from the EC table) representative of a first electrical characteristic threshold for the MLC in the designated state, and determine that the sensing feedback does not satisfy the threshold data. In response, the PEVG component can apply to the MLC a second voltage pulse for a second duration that differs from the first duration and/or has a second voltage magnitude that differs from the first voltage magnitude.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
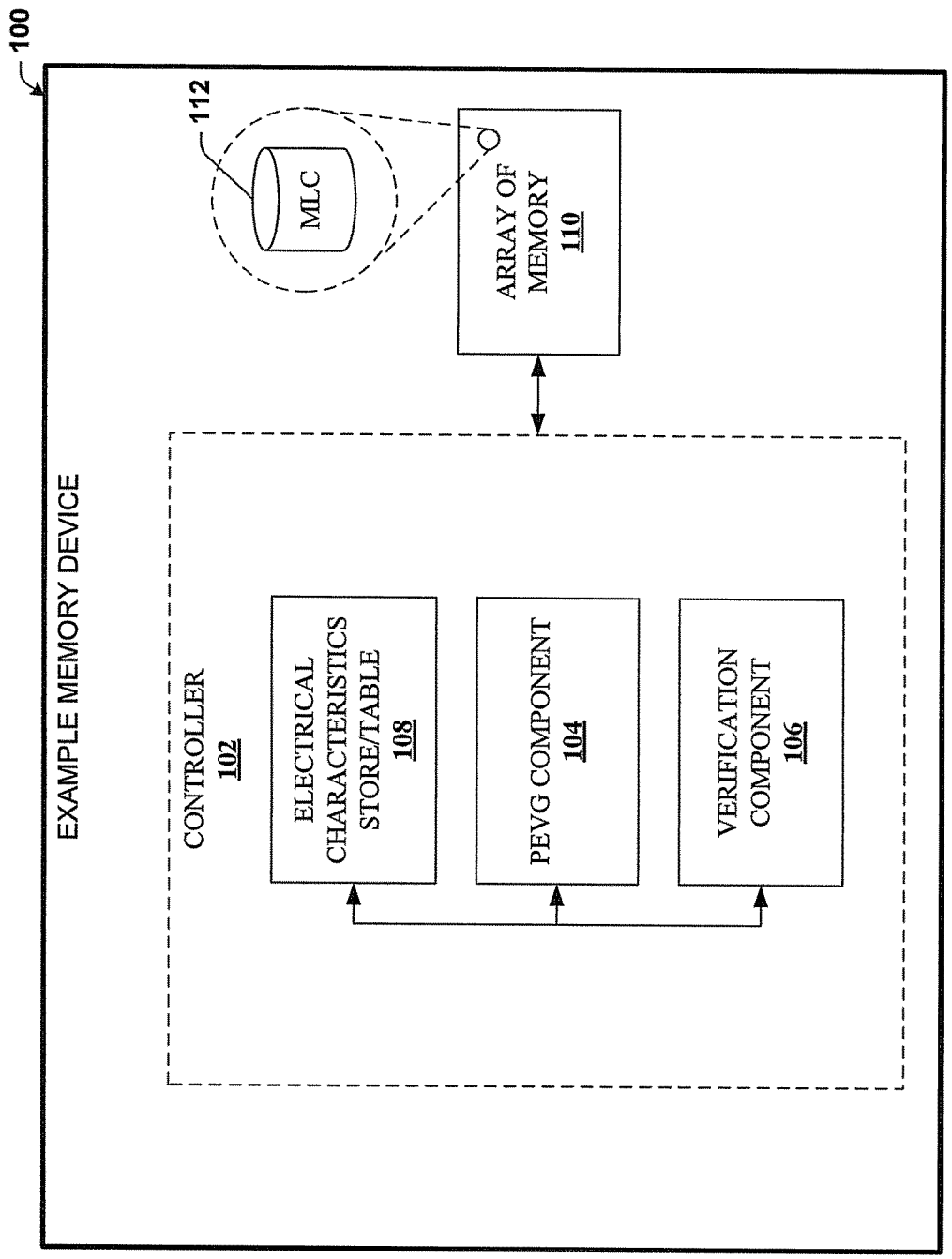
FIG. 1 illustrates a block diagram of an example memory device that can provide for enhanced program, erase, or other operations that set multi-level cell (MLC) memory to a designated state in accordance with certain embodiments of this disclosure.

Multi-level cell (MLC) memory has a distinct advantage over single-level cell (SLC) memory in that one memory cell of MLC memory can represent multiple bits of information. In contrast, a single memory cell of SLC memory typically only supports two measurably distinct states. These two measurably distinct states can be mapped to data values "0" and "1", respectively. Hence, each cell of SLC memory can represent one bit of information, either a "0" or a "1". On the other hand, MLC memory supports many more measurably distinct states and therefore each cell of MLC memory can represent more than one bit of information. For example, consider MLC memory in which a single cell supports four measurably distinct states. In that case, those four states can be mapped to data values of "00", "01", "10", and "11", respectively. Thus, each cell of this four-state MLC memory can represent two bits of information. As another example, MLC memory in which a single cell supports eight measurably distinct states can represent three bits of information. For binary information representation, the number of distinct states, s, that can be sensed is equal to two raised to the power of the number of bits, b, that can be represented by the MLC. In other words, $s=2^b$. For example, for an MLC to represent two bits of information, four distinct states must be capable of being distinguished via sensing. For an MLC to represent three bits of information, eight distinct states must be capable of being distinguished via sensing. For an MLC to represent four bits of information, sixteen distinct states must be capable of being distinguished via sensing, and so on. In order to simplify explanation, examples of MLC memory used herein generally relate to two-bit MLC (e.g., b=2), but it is understood that these examples are not intended to be limiting. The disclosed subject matter can be used in cases where b is substantially any number.

Because a memory cell of MLC memory can represent additional bits of information compared to SLC memory, MLC memory generally provides greater memory density. For example, compared to SLC memory with the same number of memory cells, two-bit MLC can store twice as much information and three-bit MLC can store thrice as much information.

One challenge associated with MLC memory is to precisely control operations (e.g., programming or erasing operations) that are intended to set a given memory cell to a particular state, generally by applying a voltage pulse to the selected memory cell via a bitline and/or wordline. In an ideal world, a predefined voltage pulse would uniformly set every cell to which it is applied to exactly the same state as every other cell to which that uniform voltage is applied. Thus, upon subsequent sensing (e.g., reading) of the cell, defined electrical characteristic (e.g., resistance, conductance, etc.) values would also be uniform for every cell set to the desired state. Unfortunately, due to slight manufacturing differences, wear-and-tear, as well as many other factors, applying a defined voltage pulse that is calculated and/or expected to set a particular memory cell to a particular state is not always successful. In those cases, subsequent sensing (e.g., reading) of the cell might yield a result that the selected cell is in a different state than the one the defined voltage pulse should have produced, and therefore, data values 'stored' to the memory cell might differ from data values intentionally 'programmed' to that cell. Furthermore, it is desirable to program the cells within a tight distribution to increase read margins and reduce read errors due to disturbances such as temperature, which tend to widen the distribution.

Since a defined voltage pulse does not always uniformly operate to set memory cells to a designated state, most MLC memory supports a range values. For example, if, in response to a sensing pulse, a measurement of the resistance through the memory cell is within a particular range, then the cell is reported to be in the state associated with that range. Hence, the cell will be deemed to store data values mapped to that state. If the reported resistance is below the lower threshold of the range or above the upper threshold of the range, then the cell is not reported to be in the state associated with that range, so mapped data values might differ from what a program operation intended or not provide the required margins.

The size of these ranges affect what is known as sensing margin. Sensing margin directly affects the number of measurably distinct states that MLC memory can support, which in turn bounds the number of bits of information that each cell of MLC memory can represent. In other words, narrowing the sensing margin can increase the number of measurably distinct states MLC memory can support and/or increase the number of bits of information that a given MLC can represent.

Embodiments of this disclosure relate to mechanisms or techniques for improving operations such as program or erase operations that are intended to set a state of one or more multi-level memory cells to a selected or designated state. In some embodiments, a first voltage pulse can be applied to an MLC that is intended to set the MLC to a desired state. Thereafter, a sensing pulse can be applied to the MLC, and one or more suitable electrical characteristic (EC) such as resistance or current can be measured and reported. This measured EC can then be compared to thresholds that define the range of acceptable values for the EC in order for the MLC to be deemed to be in the selected state. If the measured EC is within the range, then the initial program (or other) operation is deemed to have been successful and no further action need be performed. Otherwise, if the measured EC is not within the suitable range threshold, then one or more additional voltage pulses can be applied in order to properly set the MLC to the designated state.

When programming a number of MLC cells at substantially the same time, a first voltage can be applied to each of the MLC cells accordingly to set them to the desired state(s). Thereafter, sensing pulses can be applied to the MLC cells to measure their ECs and the measured ECs can then be compared to thresholds that define the range of acceptable values for the ECs. Operation on MLC memory cells having ECs within the range are deemed to have been successful and no further actions need be performed on those cells. The remaining cells with the measured ECs not being within the suitable range threshold are then considered not being successful and are applied with one or more additional voltage pulses in order to properly set the MLC to the designated state.

After each additional voltage pulse, sensing operations can be repeated to determine whether or not the MLC is in the designated state, and more voltages pulses applied generally only when such is not the case. In some embodiments, these additional voltage pulses can be applied for a shorter duration than the initial voltage pulse and/or preceding voltage pulses. In some embodiments, these additional voltage pulses can have a lesser voltage magnitude than the initial voltage pulse and/or preceding voltage pulses. In this regard, the disclosed subject matter can operate to fine-tune program or erase operations in a manner that is tailored to some extent to the physical characteristics of each individual MLC. Advantageously, the disclosed subject matter can operate to improve the success rate, speed, or power consumption of certain memory operations such as programming or erasing. Advantageously, the disclosed subject matter can operate to improve the precision of certain memory operations such as programming or erasing, which can narrow sensing margin ranges and/or improve the number of bits that can be represented by MLC memory.

Example Memory Devices for MLC Programming/Erasing

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example memory device 100 is depicted. Memory device 100 can be a removable storage device, which can be connected to or disconnected from a computing device (e.g., a computer, a laptop, a terminal, a smart phone, a table computer, etc.) by way of a communication interface (e.g., a universal serial bus (USB) interface, or another memory bus or interface). In some embodiments, memory device 100 can be deployed on a hardware card for connecting with a server device or other computing device. In still other embodiments, memory device 100 can be a stand-alone device configured to communicate with a remote host device via a suitable remote communication platform (e.g., a wireless interface, a cellular interface, a satellite interface, a wired interface, an Ethernet interface, a broadband over power line interface, memory modules such as DIMMs communicating over buses or interfaces such as DDR3 or DDR4, etc., or the like, or a suitable combination thereof). Memory device 100 can comprise a program and erase voltage generation (PEVG) component 104, verification component 106, an electrical characteristics data store or data table 108, and array of memory 110 as well as other suitable components. In some embodiments, components 104, 106, and/or 108 can be included in a controller 102.

Components described herein can be configured to interface to and control array of memory 110. Array of memory 110 can comprise multi-level cell (MLC) 112 characterized by a set of distinct states of MLC 112 that, respectively, represent multiple bits of information. In some embodiments, MLC 112 can be a resistive, two-terminal memory cell. Examples of two-terminal memory technology include resistive memory (e.g., resistive-switching memory cell), ferromagnetic memory, phase change memory, magneto-resistive memory, organic memory, conductive bridging memory, and so on. Embodiments of the subject disclosure can provide a filamentary-based memory cell. One example of a filamentary-based memory cell can comprise: a conductive layer (e.g. TiN, TaN, TiW) or a conductive silicon (Si) bearing layer (e.g., polysilicon, polycrystalline SiGe, etc.) a resistive switching layer (RSL) having crystalline defects or defect regions (e.g. amorphous silicon, intrinsic silicon, non-stoichiometric silicon oxide); and an active metal layer for providing filament forming particles to the defect regions of RSL. In various examples, the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)), alloys of such metals, as well as materials rich in such metals, such as non-stoichiometric metal compounds. Other suitable conductive materials, as well as compounds or combinations of the foregoing can be employed for the active metal layer in some aspects of the subject disclosure. In various embodiments, particles of metal derived from the active metal layer become trapped within the defect regions of the RSL. These trapped particles are neutral metal particles that form conductive filaments within the RSL. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes. An illustrative example of MLC 112 can be found at FIG. 2, which can now be referenced.

Figure 2:
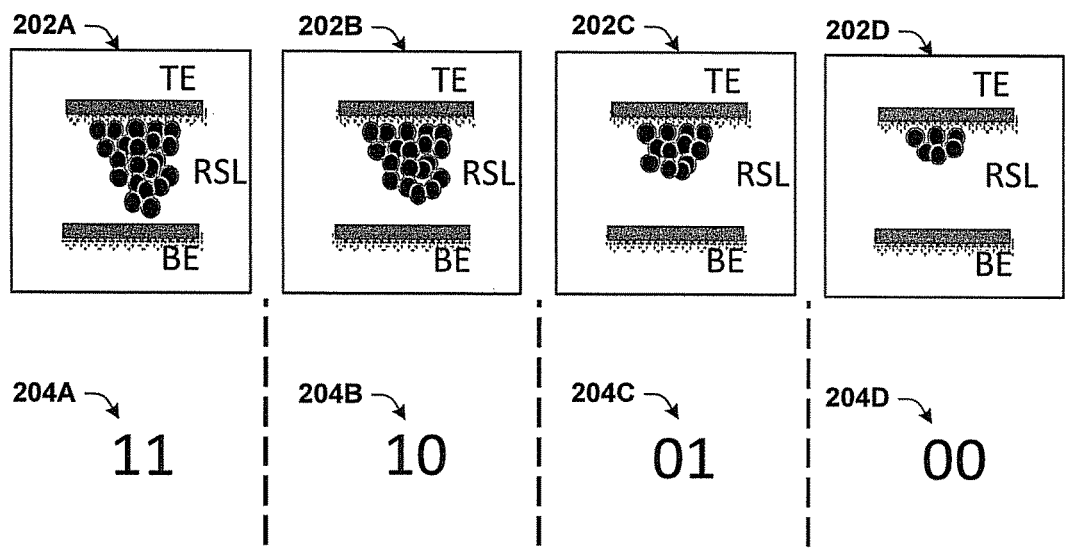
FIG. 2 depicts an example illustration depicting an example representation of a two-terminal MLC with four distinct states, each one representing two bits of information in accordance with certain embodiments of this disclosure.

While still referring to FIG. 1, but turning now as well to FIG. 2, illustration 200 is provided. Illustration 200 depicts an example representation of a two-terminal MLC with four distinct states, each one representing two bits of information. In this example, the memory cell (e.g., MLC 112) is two-terminal memory that, as noted above, is a filamentary-based memory. Two-terminal memory has two terminals or electrodes. Herein, the terms "electrode" and "terminal" are used interchangeable. Generally, a first electrode of two-terminal memory is referred to as a "top electrode" (TE) and a second electrode of the two-terminal memory is referred to as a "bottom electrode" (BE), although it is understood that electrodes of two-terminal memory can be according to any suitable arrangement, including a sideways memory cell. Situated between the TE and BE of a two-terminal memory cell is typically an interface layer sometimes referred to as a switching layer or a resistive switching layer (RSL). Application of a suitable voltage (e.g., a program pulse) to one of the electrodes can cause a conductive filament to form in the interface layer. The conductive filament can be composed of metal particles of a suitable active metal that is typically included in or coupled to the electrode receiving the program pulse. By convention and as generally described herein, the TE receives the program pulse and the BE is grounded, but such is not intended to be limiting for all embodiments. Conversely, applying an erase pulse to one of the electrodes (generally a pulse of opposite polarity as the program pulse or to the opposite electrode as the program pulse) can remove all or a portion of the filament, e.g., by driving the metal ions or other material that forms the filament back toward the active metal source. Properties of this conductive filament as well as the extent of its presence or absence affect the electrical characteristics of the two-terminal memory cell such as, for example, lowering the resistance and/or increasing conductance across the two terminals when the conductive filament is fully or partially present as opposed to when not present. Examples presented herein generally relate to bipolar memory cells, wherein the erase pulse is applied with reverse bias (e.g., of opposite polarity) relative to the program pulse. However, it is understood that in some embodiments MLC 112 can be a unipolar memory cell, wherein the erase pulse has the same polarity as the program pulse, but a markedly different magnitude, typically a higher voltage magnitude.

The four states 202A-202D illustrated in this example, therefore, relate to the extent to which the conductive filament exists in the RSL. In state 202A, the conductive filament substantially spans the entire length of the RSL. In state 202B, the conductive filament spans a good portion of the RSL, while in state 202C, the conductive filament spans only a small portion of the RSL. In state 202D, the conductive filament substantially does not exist and/or no or very few active metal particles exist in the RSL. Since particles of the conductive filament are electrically conductive, whereas the RSL is highly electrically resistive, the resistance of a memory cell in state 202A is lower than the resistance of the same cell in states 202B-D. In this regard, sensing the resistance or some other suitable electrical characteristic (e.g., conductance) of the memory cell can effectively distinguish between the various states 202A-202D. Hence, each of the states can be logically mapped to corresponding data values 204A-204D. By convention and as used herein, the lowest resistance state (e.g., 202A) is mapped to "11" (e.g., 204A) and so on, but it is understood that other conventions might be used and are within the scope of this disclosure. It is further understood although many examples used herein relate to 2-bit MLC in which a memory cell can represent two bits of information, the disclosed subject matter can relate to memory cells that represent substantially any number of bits of information.

Figure 3:
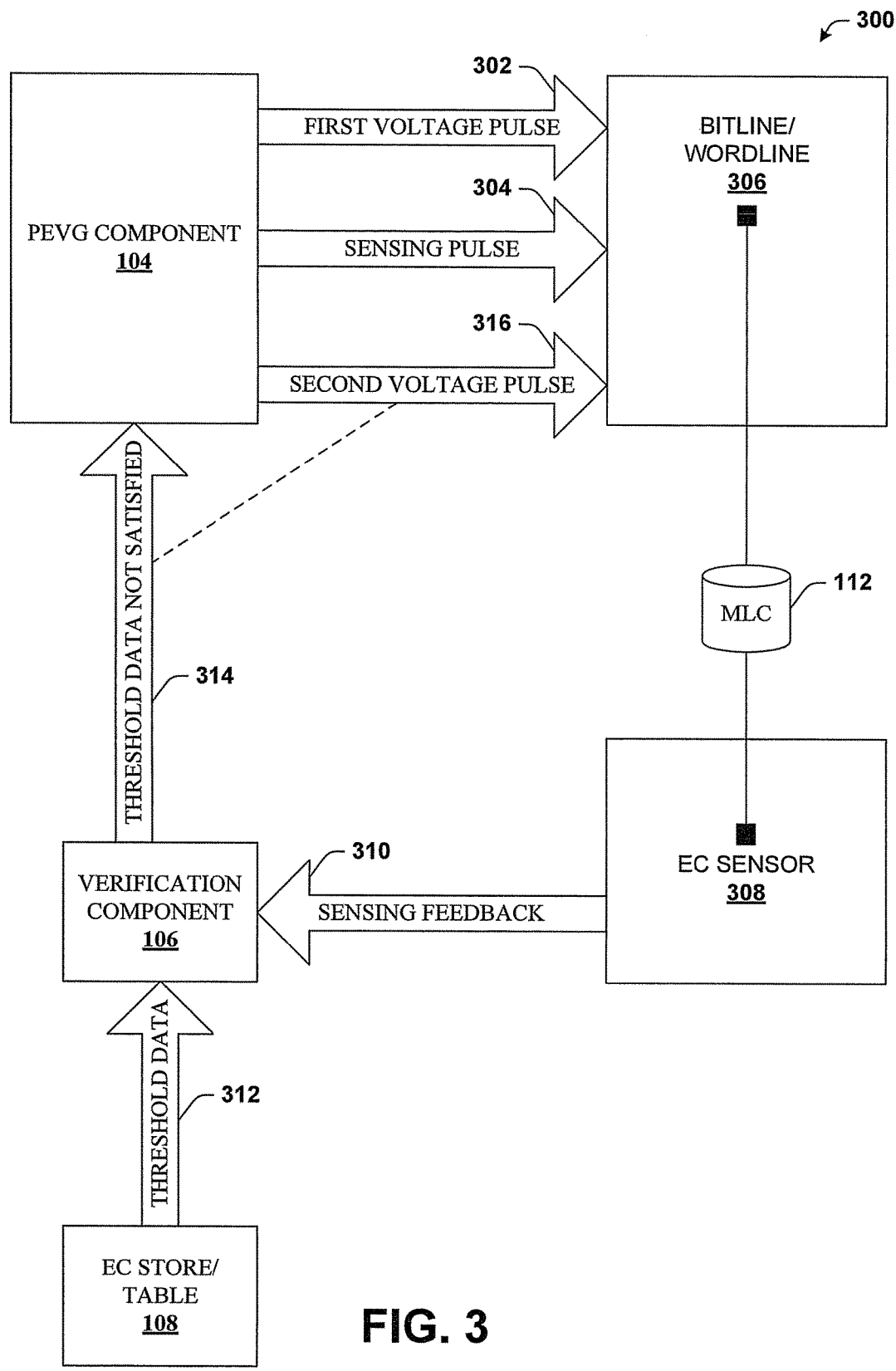
FIG. 3 illustrates a block diagram of an example system that can provide for additional aspect or elements in connection with components detailed herein in accordance with certain embodiments of this disclosure.

Turning now to FIG. 3, system 300 is illustrated. System 300 can provide for additional aspect or elements in connection with components introduced in FIG. 1 and herein. PEVG component 104 can be configured to apply first voltage pulse 302 to MLC 112. First voltage pulse 302 can have particular characteristics (e.g., pulse duration, voltage magnitude, etc.) that are specifically tailored to set MLC 112 to a designated state, as further illustrated by FIG. 4.

Figure 4:
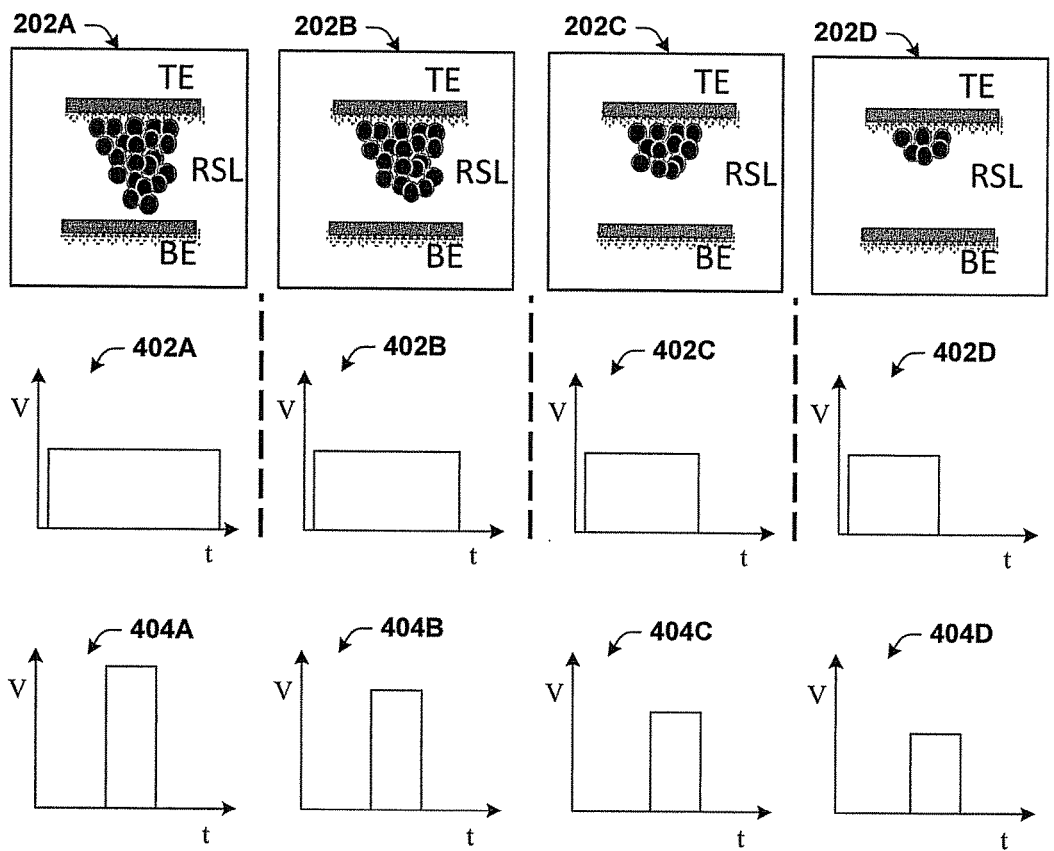
FIG. 4 depicts an example illustration depicting various example first voltage pulses configured to set the MLC to the associated state based on distinct pulse durations or distinct voltage magnitudes in accordance with certain embodiments of this disclosure.

While still referring to FIG. 3, but turning now well to FIG. 4, illustration 400 is provided. Illustration 400 depicts various example first voltage pulses 302 configured to set the MLC 112 to the associated state based on distinct pulse durations or distinct voltage magnitudes. For example, if first voltage pulse 302 is configured to set MLC 112 to state 202A, then the duration of the pulse (illustrated by 402A) or the voltage magnitude of the pulse (illustrated by 404A) might be greater than the case in which first voltage pulse 302 is configured to set MLC 112 to states 202B-D. Such is the case because, for two-terminal memory, a higher magnitude or longer duration pulse will drive more active metal particles into the RSL and state 202A requires more particles than do the other states 202B-D. Thus, as illustrated by elements 402A-402D, the duration of pulses can be manipulated to effect specific state changes. Additionally or alternatively, as illustrated by elements 404A-404D, the voltage magnitude of pulses can be manipulated to effect specific state changes. Characteristics of first voltage pulse 302 can also be determined based on an initial state of MLC 112. For example, setting MLC 112 to state 202B when MLC 112 is initially in state 202A might be accomplished by applying a negative polarity pulse to MLC 112 (e.g., to drive some of the filament-forming particles back toward the active metal source). However, when MLC 112 is initially in state 202C (as opposed to 202A), setting MLC 112 to state 202B might be accomplished by applying a positive polarity pulse. For ease of explanation, examples used herein (e.g., 402A-D and 404A-D) presume that when setting MLC 112 to a designated state, MLC 112 has an initial state similar to its manufactured state (e.g., no active metal particles in the RSL).

Still referring to FIG. 3, as depicted, first voltage pulse 302 can be applied to MLC 112 via a bitline or via a wordline, both of which are denoted by reference numeral 306. If all goes as expected, first voltage pulse 302 will set MLC 112 to the designated state. However, as noted previously, such is not always the case. Accordingly, after application of first voltage pulse 302, a sensing pulse 304 can be applied, during which sensing feedback 310 can be collected by electrical characteristic sensor 308 and reported to verification component 106. Unlike first voltage pulse 302 or other pulses detailed herein, sensing pulse 304 is not designed to affect the state of MLC 112, but rather only apply a small voltage to MLC 112 sufficient to take electrical characteristic measurements and/or 'read' MLC 112. Thus, sensing pulse 304 is typically configured to be smaller in terms of magnitude or duration relative to pulses that are designed to change the state of MLC 112. Sensing feedback 310 can relate to a resistance associated with MLC 112 during the sensing pulse 304, a conductance associated with MLC 112 during the sensing pulse 304, or some other suitable electrical characteristic or value.

In response to sensing pulse 304, verification component 106 can receive sensing feedback 310 and compare sensing feedback 310 to threshold data 312. Threshold data 312 can be received from EC store/table 108, which can contain electrical characteristic thresholds and other data associated with MLC 112. For example, EC data in table 108 can relate to EC thresholds or ranges of MLC 112 in any supported state or pulse or other EC data related to setting MLC 112 to a given state.

If sensing feedback 310 satisfies the threshold data 312, then it can be assumed that first voltage pulse 302 successfully set MLC 112 to the designated state and no further action need be taken. On the other hand, if verification component 106 determines that sensing feedback 310 does not satisfy threshold data 312, then further action can be implemented. For example, verification component 106 can provide an indication to PEVG component 104 that such is the case, which is denoted by reference numeral 314. In response, PEVG component 104 can apply to MLC 112 a second voltage pulse 316. In embodiments, second voltage pulse 316 can be applied for a defined duration that differs from the duration of first voltage pulse 302. In some embodiments, second voltage pulse 316 can have a voltage magnitude that differs from the voltage magnitude of first voltage pulse 302.

Figure 5:
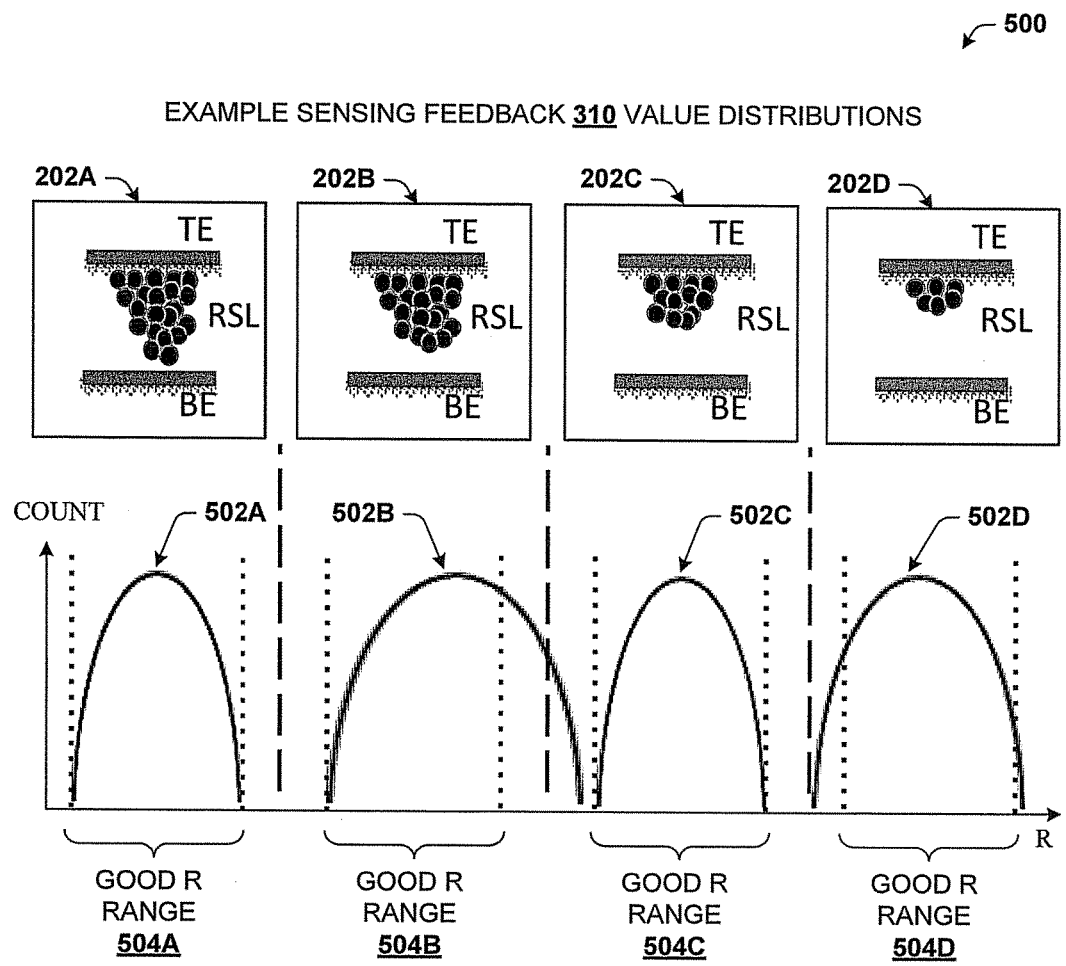
FIG. 5 depicts an example illustration depicting various example sensing feedback value distributions in accordance with certain embodiments of this disclosure.

Turning now to FIG. 5, illustration 500 is provided. Illustration 500 depicts various example sensing feedback 310 value distributions. In the upper portions of illustration 500, the exemplary states 202A-202D are again depicted. In the lower portions, associated example value distributions 502A-502D are illustrated plotted on a graph that shows distribution count over an associated resistance value. As shown, each of the supported states 202A-202D has an associated range (e.g., 504A-504D) of resistance values that are representative of the states 202A-202D. Said differently, when sensing pulse 304 is applied to MLC 112 and the measured resistance value (e.g., included in sensing feedback 310) is a value in range 504A, then MLC 112 is read to be in state 202A. If the resistance value is not within range 504A, then MLC 112 is not read to be in state 202A. Thus, the dotted lines represent resistance thresholds that bound the associated ranges 504A-504D. Distributions 502A-504D that are within those dotted lines therefore represent good distributions, such as distribution 502A and 502C.

Distributions 502B and 502D, on the other hand, illustrate certain problems since these distributions are wider and not entirely within the associated good ranges 504B and 504D. Specifically, distribution 502B encompasses resistance values that are higher than the upper threshold of range 504B, whereas distribution 502D encompasses resistance values that are below than the lower threshold of range 504D. One explanation of these situations is that when first voltage pulse 302 is applied to MLC 112 in order to set MLC 112 to state 202B or 202D, corresponding sensing pulses 304 tend to report that the resistance values are too high (in the case of 202B) or too low (in the case of 202D). Hence, first voltage pulse 302 has not properly set the state of MLC 112 to the designated/desired state (e.g., 202B, 202D), and remedial action may be required such as application of second voltage pulse 316.

Figure 6:
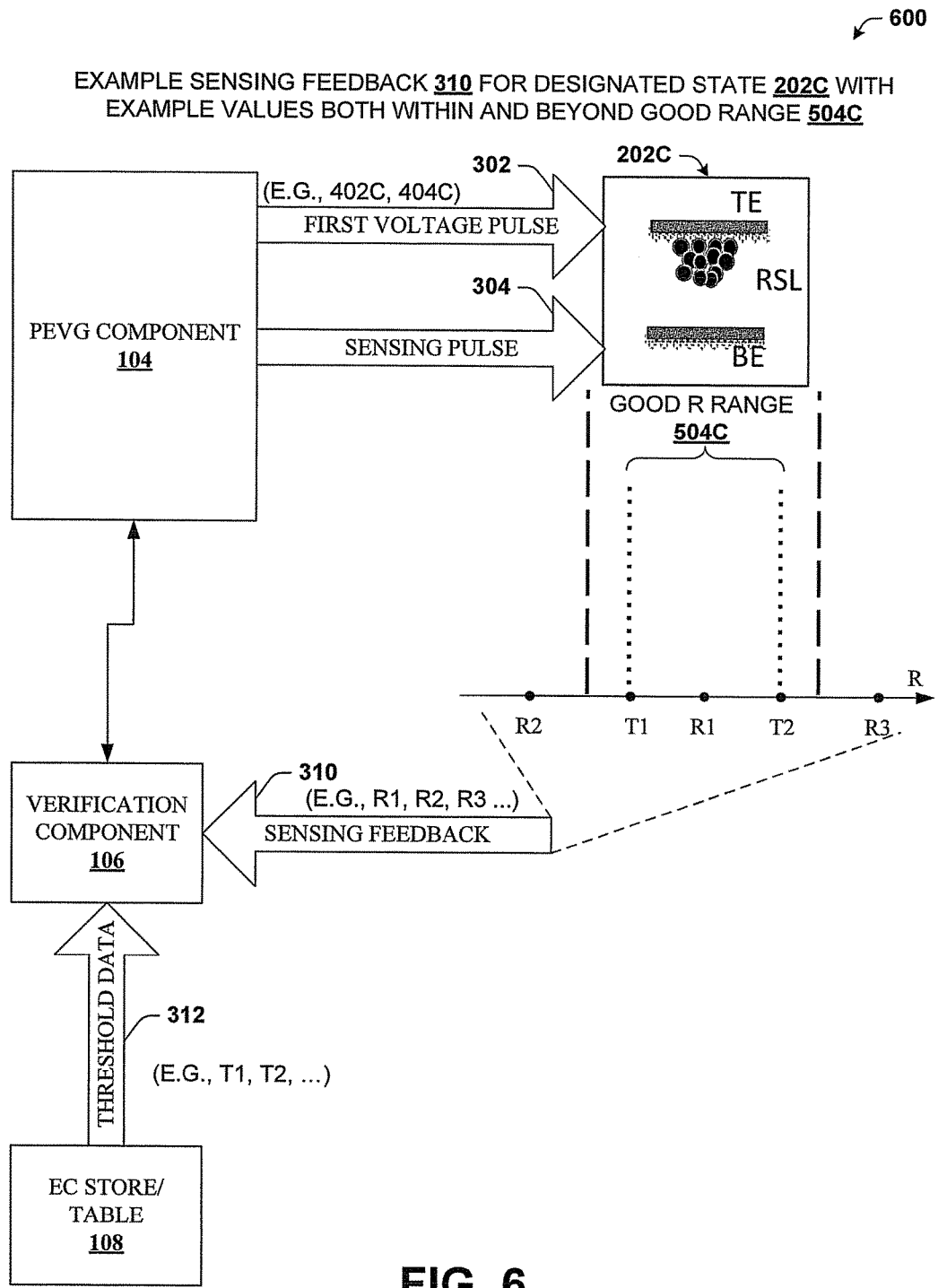
FIG. 6 depicts a block diagram describing an example system that provides for various examples of sensing feedback both within and beyond a good range in connection with a specific designated state in accordance with certain embodiments of this disclosure.

Referring now to FIG. 6, system 600 is depicted. System 600 provides for various examples of sensing feedback both within and beyond a good range in connection with a specific designated state. In this case, controller 102 has determined that MLC 112 is to be set to state 202C. Thus, PEVG component 104 can apply to MLC 112 first voltage pulse 302, examples of which can be pulse 402C (a pulse with a duration that differs from other pulses) or pulse 404C (e.g., a pulse with a voltage magnitude that differs from other pulses). Thereafter, PEVG component 104 can apply sensing pulse 304. In response to sensing pulse 304, verification component 106 can receive sensing feedback 310, which is here related to three different examples, R1, R2, and R3. As noted, in order for MLC 112 to be read to be in state 202C, the resistance value read during sensing pulse 304 is within good resistance range 504C, which is bounded by two thresholds, T1 and T1, which can be included in threshold data 312. R1 is in the center of good range 504C and therefore appears to be an optimal value. Upon receiving R1 (e.g., included in sensing feedback 310), verification component 106 can compare R1 to one or both T1 and T2, and identify that MLC 112 is properly set to state 202C.

On the other hand, both R2 and R3 are outside of good range 504C. R2 has a lower resistance value than the lower boundary (e.g., T1) of good range 504C and R3 has a higher resistance value than the upper boundary (e.g., T2) of good range 504C. Hence, verification component 106 can determine that R2 fails to satisfy threshold data 312 because R2 is less than T1. R3 fails to satisfy threshold data 312 because R3 is more than T2. In either case, verification component 106 can notify PEVG component 104 and second voltage pulse 316 can be asserted in order to move either R2 or R3 inside good range 504C. Appreciably, second voltage pulse 316 aimed at rectifying R2 will differ from second voltage pulse 316 aimed at rectifying R3, which is further illustrated in connection with FIGS. 7 and 8.

Depending on the architecture of MLC 112, in some embodiments, a greater level of control is afforded in the case of programming the cell as opposed to erasing the cell. In those embodiments, and for an erase operation (or a program operation in which the desired state has a higher resistance than the initial state) that fails to properly set the cell to the desired state, MLC 112 can be erased and then programmed to the desired state. Such has the effect of changing an erase operation to a program operation, which may provide increased control.

Figure 7:
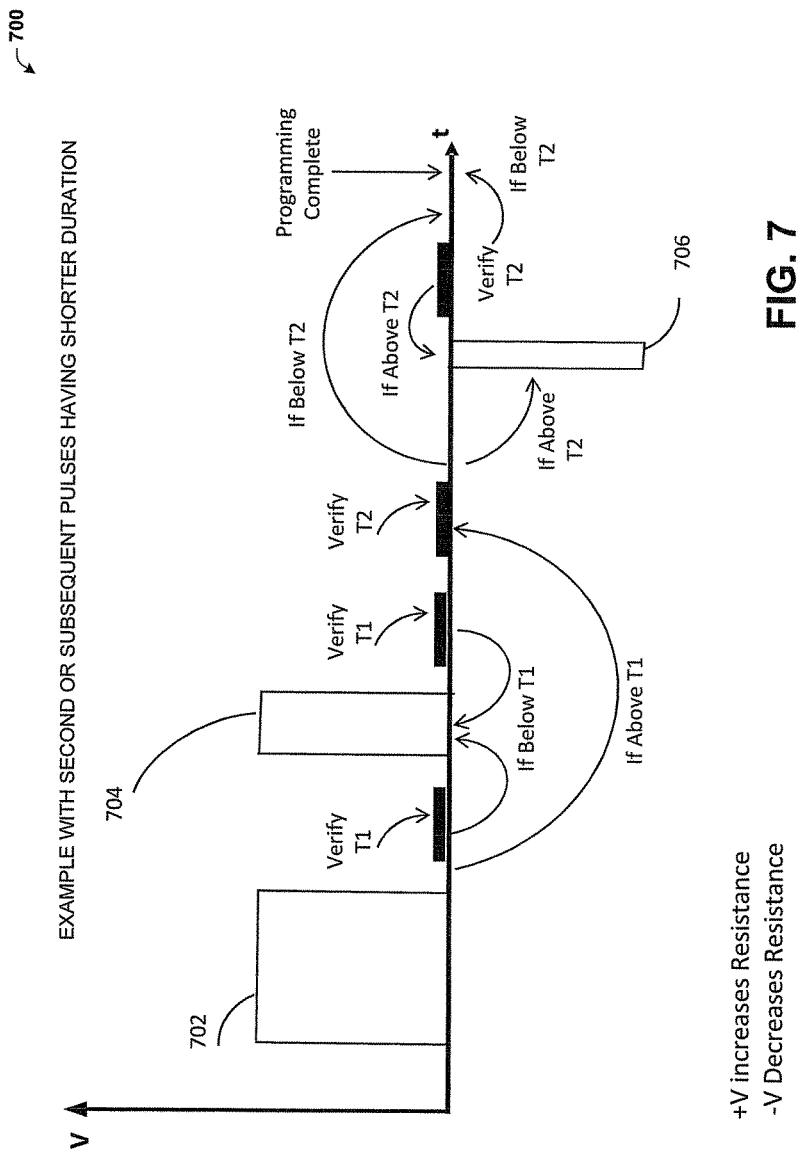
FIG. 7 depicts an example illustration depicting various example second or subsequent pulses having shorter durations than first or previous pulses in accordance with certain embodiments of this disclosure.

With reference to FIG. 7, illustration 700 is provided. Illustration 700 depicts various example second or subsequent pulses having shorter durations than first or previous pulses. In this example, three voltage pulses, 702, 704, and 706 are plotted on a graph of voltage over time. By convention, a positive voltage increases resistance (e.g., drives conductive metal particles into the RSL) and a negative voltage decreases resistance (e.g., drives conductive metal particles back toward active metal source). It is understood that this convention is not limiting and other conventions could be used. For example, applying a pulse to the opposite terminal (e.g., BE versus TE) can yield an opposite convention.

In some embodiments, pulse 702 can be substantially similar to first voltage pulse 302 that is configured to set MLC 112 to a designated state. Pulse 702 has a relatively long duration and thus can be said to be coarse. After pulse 702 a sensing pulse can be applied for verification purposes and a resistance value (or another suitable EC value) can be received by verification component 106. This resistance value can be compared to threshold data 312, including a lower threshold, T1, and an upper threshold, T2, that bound the resistance ranges that reflect that MLC 112 is in the designated state. If the resistance value is below T1, then PEVG component 104 can be informed and a subsequent voltage pulse (e.g., 704) can be applied. As depicted, pulse 704 can have a shorter duration than pulse 702 and get successively finer with each application, for instance to reduce the chances that the pulse will move the resistance value not only above T1, but above T2 as well.

After each pulse, a sensing pulse can be applied, and each time the read resistance value can be compared to threshold data 312, in this case, T1, until the resistance value is no longer below T1. The resistance value can also be compared in a like manner to T2. If the resistance value is above T2, then subsequent pulse 706 can be asserted, again with a shorter duration than previous pulses. In this case, pulse 706 has a negative polarity because the objective is to lower the resistance value below T2 rather than to raise the resistance value above T1. As before, numerous such pulses can be utilized if the T2 threshold is not reached by the first application of pulse 706, and each one can be successively shorter in duration affecting a fine-tuned precision programming operation. Once the resistance value is both above T1 and below T2, meaning within a good range to reflect the designated state, the operation can end.

Figure 8:
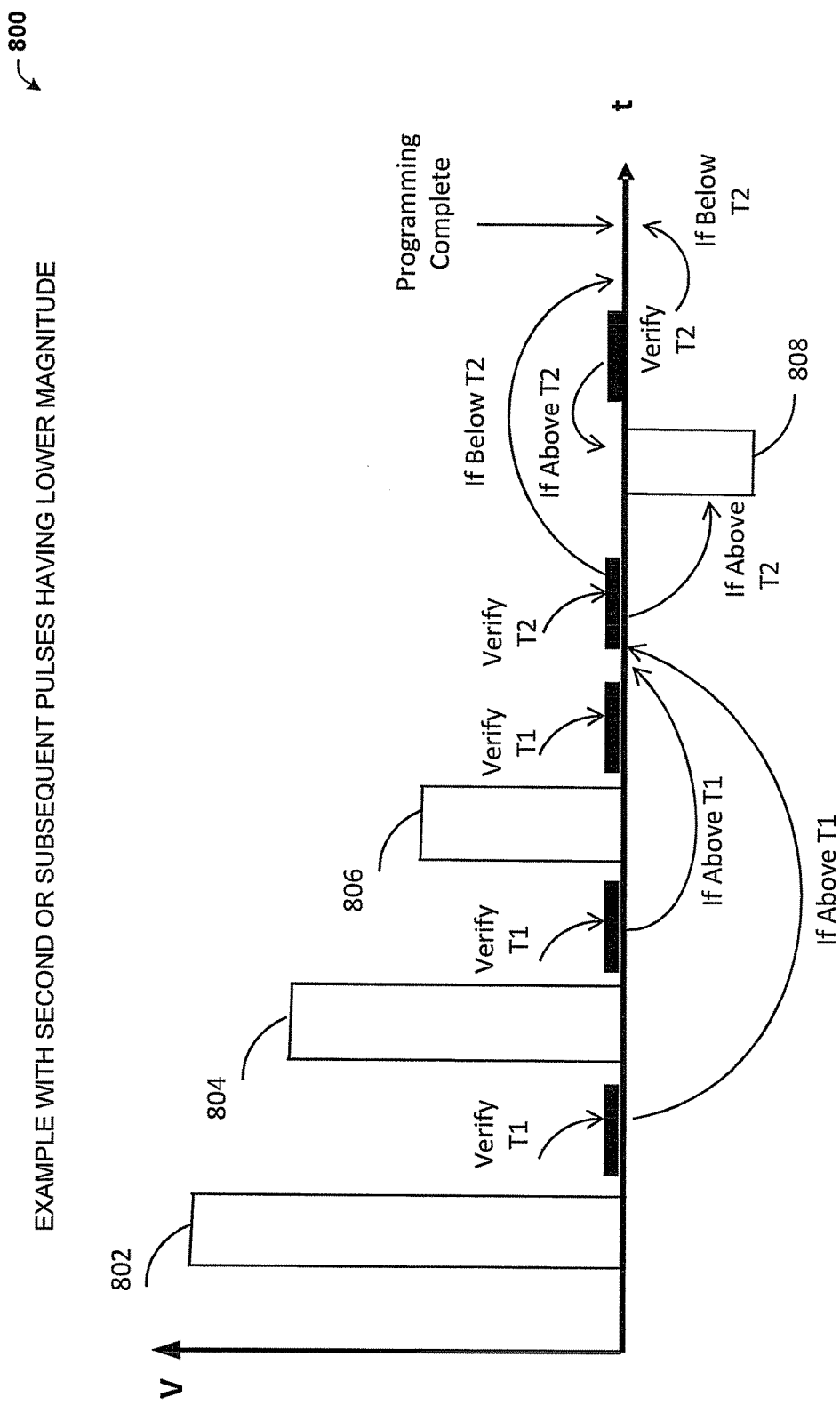
FIG. 8 depicts an example illustration depicting various example second or subsequent pulses having a lower voltage magnitude than first or previous pulses in accordance with certain embodiments of this disclosure.

Turning now to FIG. 8, illustration 800 is provided. Illustration 800 depicts various example second or subsequent pulses having a lower voltage magnitude than first or previous pulses. In this example, four voltage pulses, 802, 804, 806, and 808 are plotted on a graph of voltage over time. Again, by convention, a positive voltage increases resistance (e.g., drives conductive metal particles into the RSL) and a negative voltage decreases resistance (e.g., drives conductive metal particles back toward active metal source). Once more, it is understood that this convention is not limiting and other conventions could be used. For example, applying a pulse to the opposite terminal (e.g., BE versus TE) can yield an opposite convention.

Illustration 800 is quite similar to illustration 700, yet one distinction is that changes in voltage magnitude are effected for subsequent pulses instead of changes in pulse duration. As can be seen in illustration 800, each successive voltage pulse has a lower magnitude than the previous pulse, which serves to fine-tune the process of programming a memory cell to a designated state when the first voltage pulse fails to accomplish that end. After each voltage pulse, the memory cell can be sensed and the sensing feedback compared to the appropriate threshold data. As before, positive polarity pulses can be successively applied until the measured resistance (or another suitable electrical characteristic) is above T1 and negative polarity pulses can be successively applied until the measured resistance is below T2. Once the measured resistance is both above T1 and below T2, then the memory cell can be said to be in the designated state and the process can end.

Figure 9A:
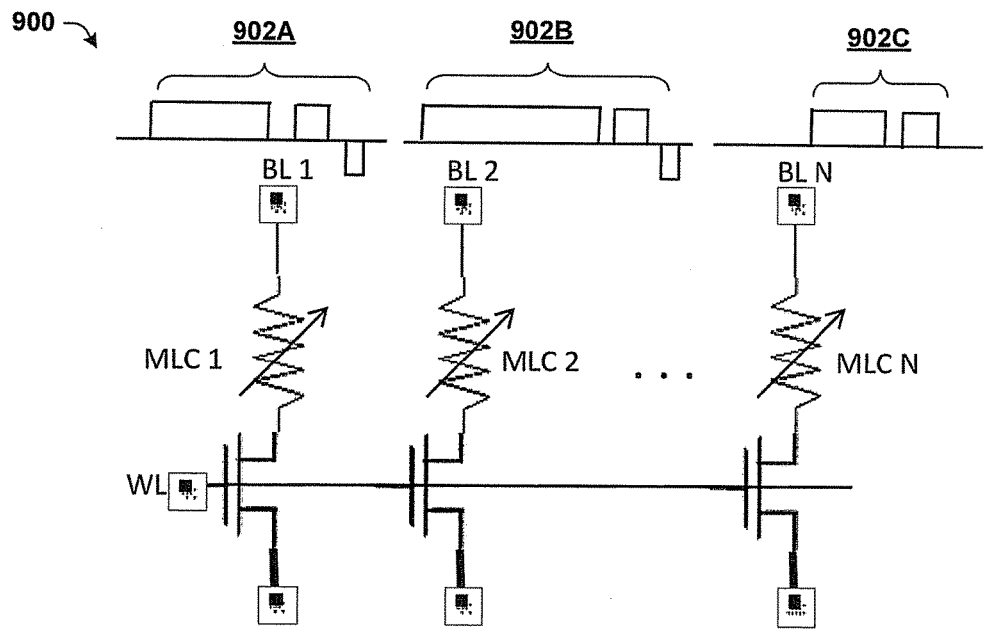
FIGS. 9A and 9B illustrates two different crossbar array architectures that are provided in connection with different embodiments of the disclosed subject matter in accordance with certain embodiments of this disclosure.
Figure 9B:
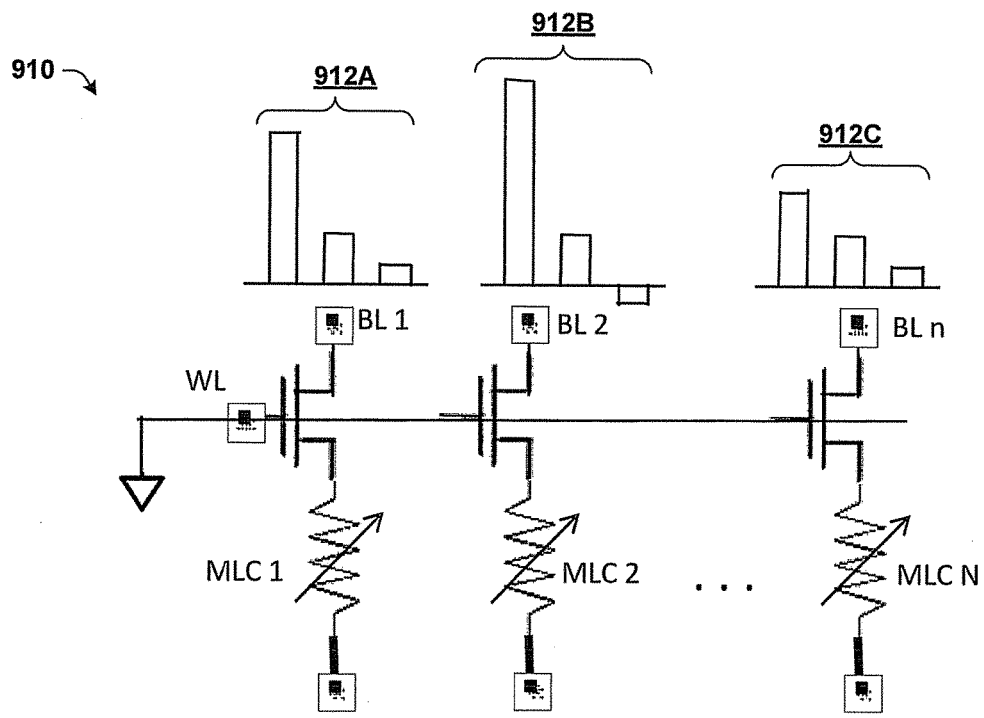

Turning now to FIGS. 9A and 9B, two different crossbar array architectures are provided in connection with different embodiments of the disclosed subject matter. In architecture 900, a series of duration-based voltage pulses (e.g., 902A-902C) are applied independently to various MLCs that share a common wordline via associated bitlines. In architecture 910, a series of magnitude-based voltage pulses (e.g., 912A-912C) are applied independently to various MLCs that share a common wordline via associated bitlines.

Figure 9C:
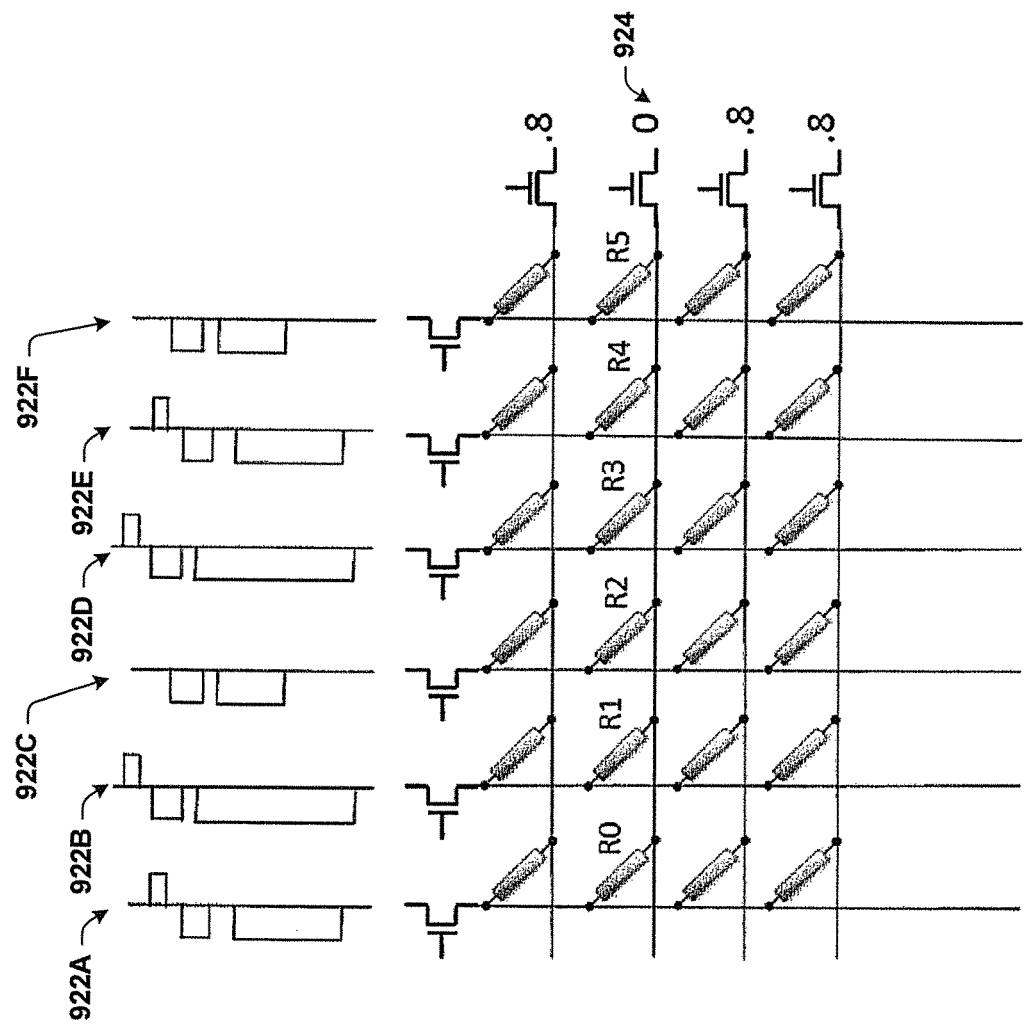
FIG. 9C illustrates a third crossbar array architecture that is provided in connection with a 1TnR architecture in accordance with certain embodiments of this disclosure.

Referring now to FIG. 9C, a third crossbar array architecture is provided in connection with embodiments of the disclosed subject matter. While architectures 900 and 910 relate to a one-transistor-one-resistor (1T1R) architectures, architecture 920 relates to a one-transistor-many-resistors (1TnR) architecture. In architecture 920, a series of voltage pulses (e.g., 922A-922F) are applied to multiple MLCs in a given column, but a particular MLC is selected to receive the voltage pulses based on the selector voltage 924, in this case zero volts. In this example, the voltage pulses 922A-922F are duration-based pulses, but it is understood that magnitude-based voltage pulses may be used as well, depending on the implementation.

Example Methods for MLC Programming/Erasing

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 10:
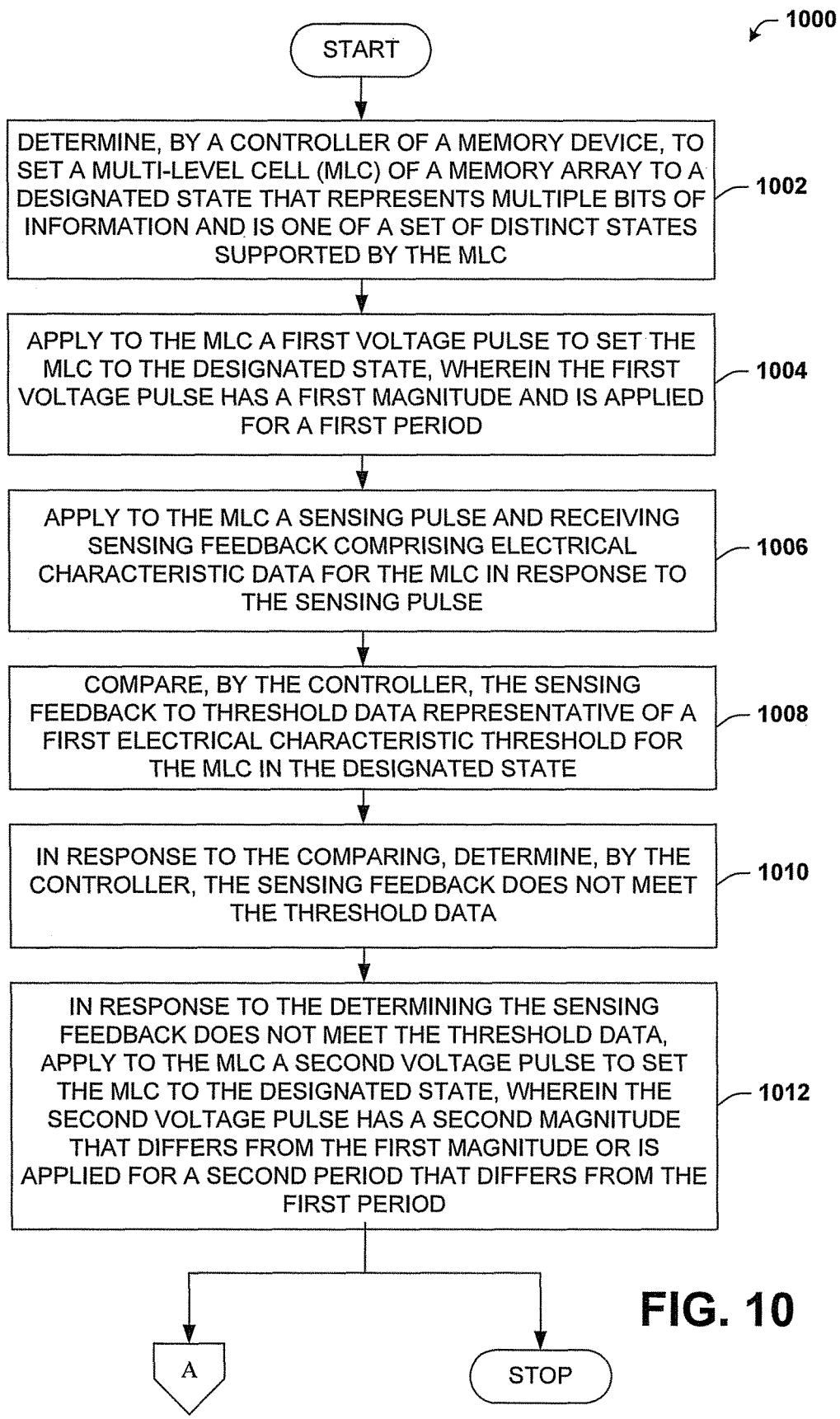
FIG. 10 illustrates an example methodology that can provide for selectively fine-tuning a program, erase, or other operation that sets an MLC to a designated state in accordance with certain embodiments of this disclosure.
Figure 11:
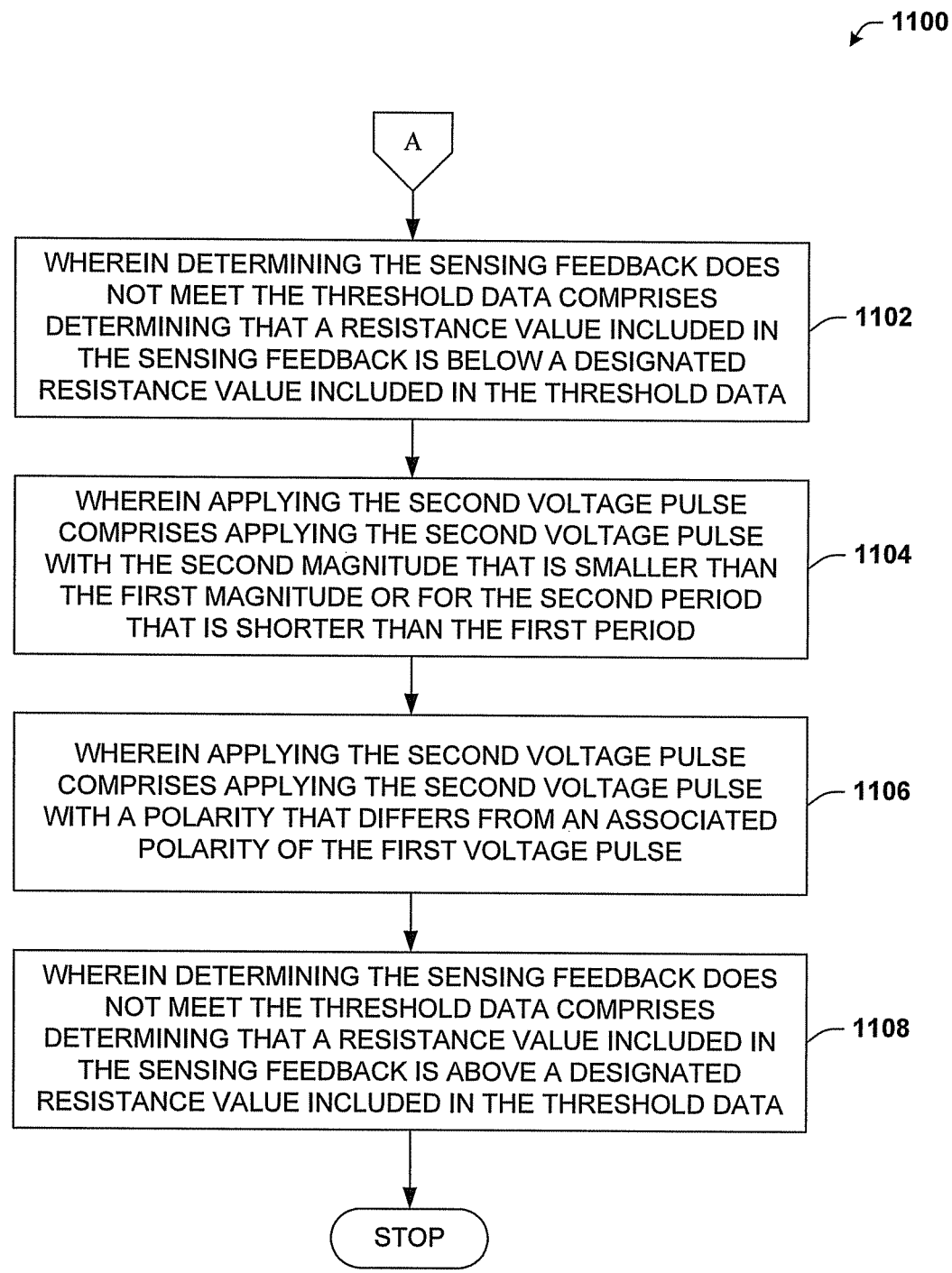
FIG. 11 illustrates an example methodology that can provide for additional aspects or elements in connection with selectively fine-tuning a program, erase, or other operation that sets an MLC to a designated state in accordance with certain embodiments of this disclosure.

In view of the exemplary diagrams described supra, process methods that can be implemented in accordance with the disclosed subject matter will be better appreciated with reference to the flow charts of FIGS. 10 and 11. While for purposes of simplicity of explanation, the methods of FIGS. 10 and 11 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 10, exemplary method 1000 is illustrated. Method 1000 can provide for selectively fine-tuning a program, erase, or other operation that sets an MLC to a designated state. At reference numeral 1002, a controller of a memory device can determine to set a MLC of a memory array to a designated state that represents multiple bits of information and is one of a set of distinct states supported by the MLC. For example, the controller can determine to set the state of the MLC to one that is mapped to the data values "11" in the case of two-bit MLC or to a state that logically maps to the data values "0110" in the case of four-bit MLC.

At reference numeral 1004, the controller (and/or a PEVG component) can apply to the MLC a first voltage pulse that is calculated or expected to set the state of the MLC to the designated state. The first voltage pulse can have a first magnitude and can be applied for a first period. These magnitude and voltage characteristics can be particularly selected for the purpose of setting the MLC to the designated state, generally in a uniform manner.

At reference numeral 1006, the controller (and/or the PEVG component) can apply to the MLC a sensing pulse. In response to the sensing pulse, the controller (and/or a verification component) can receive sensing feedback comprising electrical characteristic data for the MLC. For example, the electrical characteristic data can be a measured resistance value for the MLC during application of the sensing pulse. At reference numeral 1008, the controller (and/or the verification component) can compare the sensing feedback to threshold data representative of a first electrical characteristic threshold for the MLC in the designated state. For example, the threshold data can include a lower and upper resistance threshold value that collectively define the range of resistance values that are considered to represent the MLC in the designated state. These threshold values can be compared to the sensed resistance value and if the resistance value is within the acceptable range bounded by the upper and lower threshold values, then the MLC is deemed to be in the designated state.

On the other hand, at reference numeral 1010, the controller (and/or the verification component) can determine the sensing feedback does not meet the threshold data. Put another way, the resistance value in the sensing feedback is not within the range bounded by the upper and lower threshold values, so the MLC is deemed not to be in the designated state. In response, at reference numeral 1012, the controller (and/or the PEVG component) can apply to the MLC a second voltage pulse to set the MLC to the designated state. Generally, unlike the first voltage pulse, that can be relatively uniform and generally of a coarser configuration, the second voltage pulse can be of a finer configuration and tailored to some extent to the MLC itself based on the sensing feedback that indicates the MLC was not set to the designated state by the first voltage pulse. In order to make the second voltage pulse finer, the second voltage pulse can have a second magnitude that differs from the first magnitude (e.g., the voltage magnitude of the first voltage pulse). Additionally or alternatively, the second voltage pulse can be applied for a second period that differs from the first period (e.g., the period the first voltage pulse was applied. Method 1000 can end or continue to insert A, which is further detailed in connection with FIG. 11.

Turning now to FIG. 11, exemplary method 1100 is illustrated. Method 1100 can provide for additional aspects or elements in connection with selectively fine-tuning a program, erase, or other operation that sets an MLC to a designated state. At reference numeral 1102, the determining the sensing feedback does not meet the threshold data detailed in connection with reference numeral 1010 of FIG. 10, can comprise determining that the resistance value included in the sensing feedback is below a designated resistance value included in the threshold data.

At reference numeral 1104, the applying the second voltage pulse detailed at reference numeral 1012 of FIG. 10 can comprise applying the second voltage pulse with the second magnitude that is smaller than the first magnitude or for a second period that is shorter than the first period. At reference numeral 1106, the applying of the second voltage pulse can further comprise applying the second voltage pulse with a polarity that differs from an associated polarity of the first voltage pulse. For example, if the first voltage pulse has a polarity that is positive, then the polarity of the second voltage pulse can be negative. Typically, opposite-polarity second voltage pulses are used in connection with a determination that the sensed resistance value is beyond one of the two thresholds, but not both.

At reference numeral 1108, the determining the sensing feedback does not meet the threshold data can additionally or alternatively comprise determining that a resistance value included in the sensing feedback is above a designated resistance value included in the threshold data.

Example Operating Environments

Figure 12:
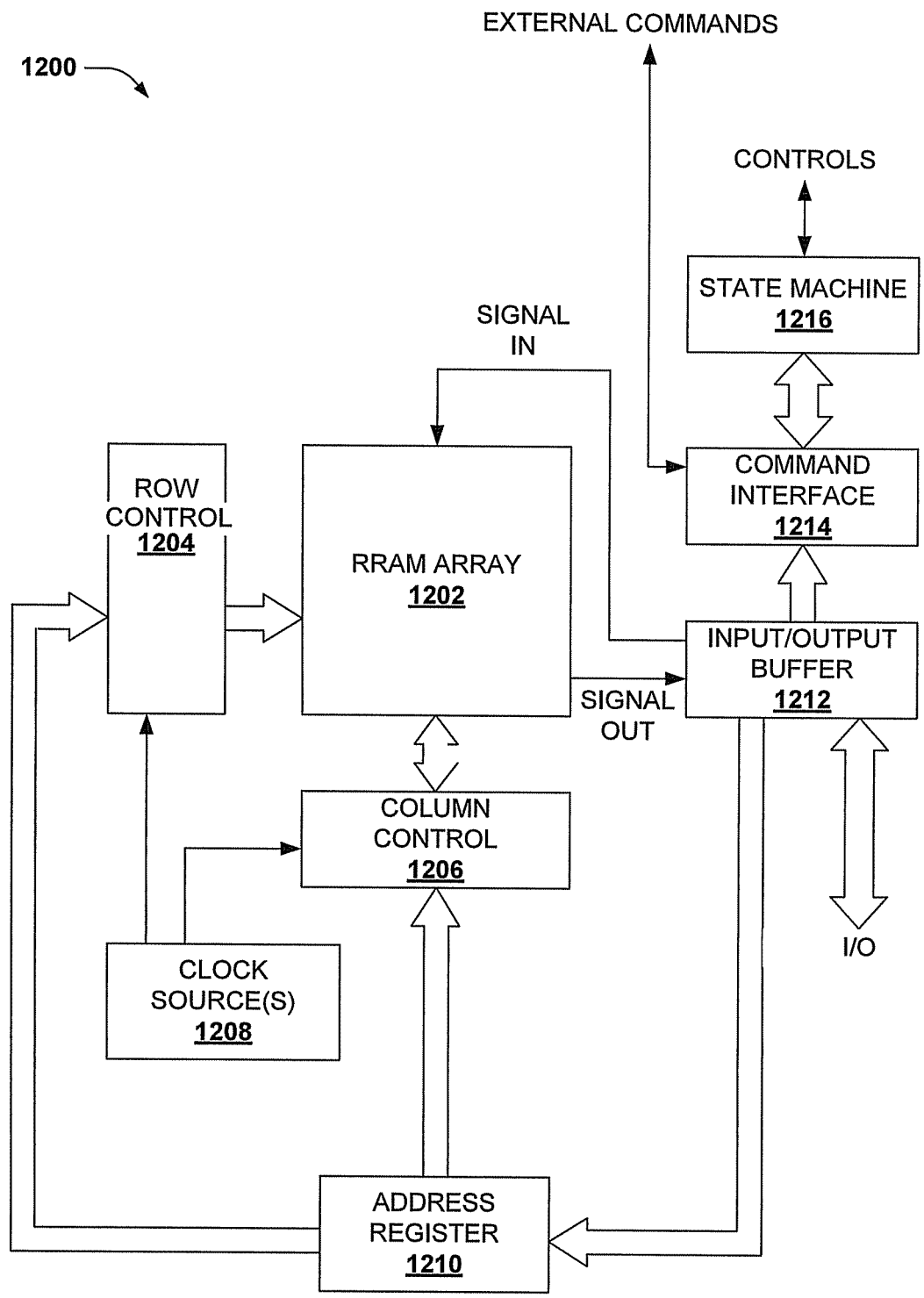
FIG. 12 illustrates a block diagram of an example electronic operating environment in accordance with certain embodiments of this disclosure.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 12 illustrates a block diagram of an example operating and control environment 1200 for a RRAM array 1202 according to aspects of the subject disclosure. In at least one aspect of the subject disclosure, RRAM array 1202 can comprise a variety of RRAM memory cell technology. Particularly, RRAM array can be configured or operated to mitigate or avoid sneak path currents of the RRAM array, as described herein.

A column controller 1206 can be formed adjacent to RRAM array 1202. Moreover, column controller 1206 can be electrically coupled with bit lines of RRAM array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of RRAM array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row control 1204 and column control 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to RRAM array 1202 via signal input lines, and output data is received from RRAM array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of RRAM array 1202. State machine 1216 receives commands from the host apparatus via input/output interface 1212 and command interface 1214, and manages read, write, erase, data input, data output, and like functionality associated with RRAM array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

The systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
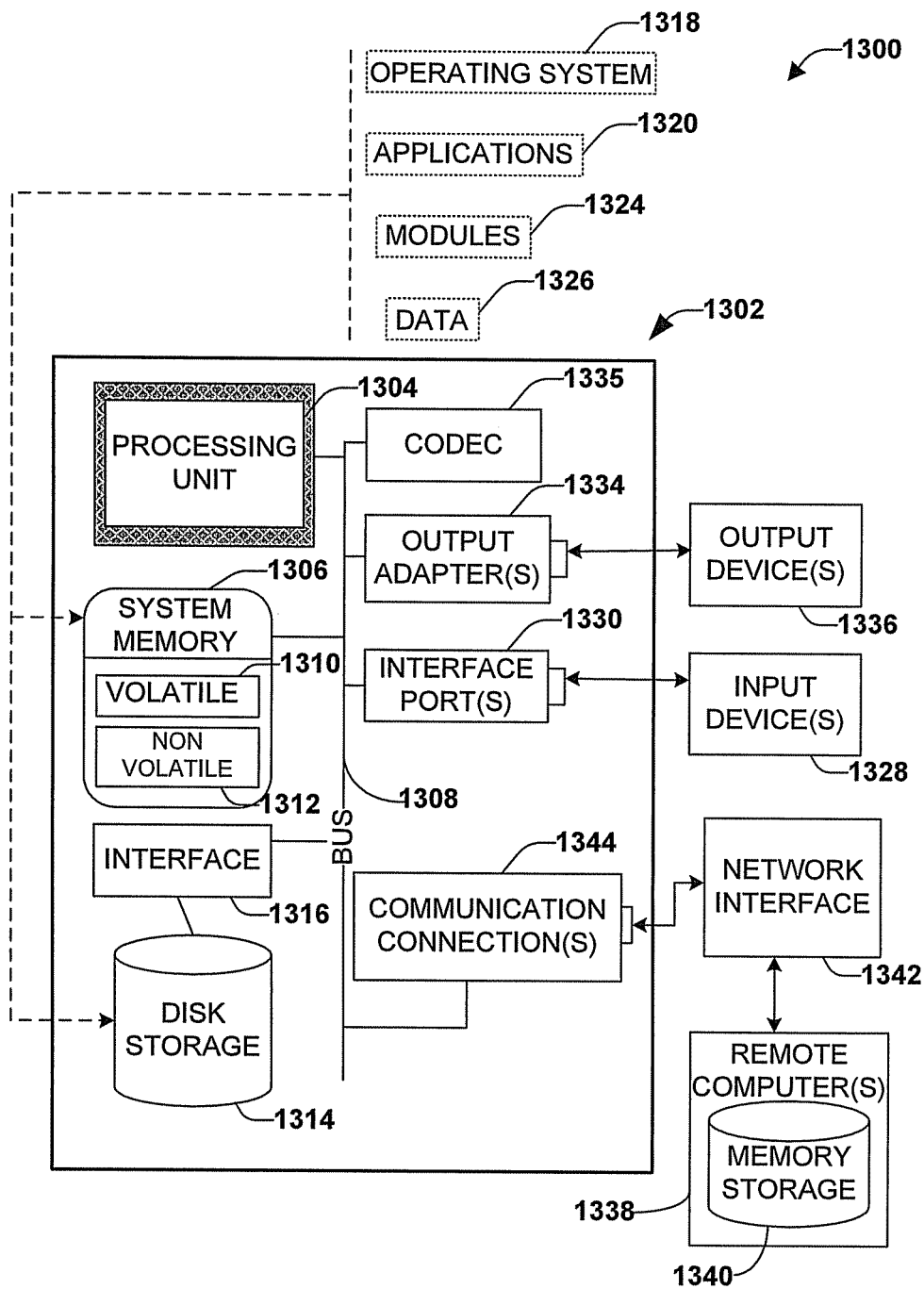
FIG. 13 illustrates a block diagram of an example computing environment in accordance with certain embodiments of this disclosure.

With reference to FIG. 13, a suitable environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1312. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or flash memory. Volatile memory 1310 includes random access memory (RAM), which acts as external cache memory. According to present aspects, the volatile memory may store the write operation retry logic (not shown in FIG. 13) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1302 may also include removable/non-removable, volatile/non-volatile computer storage medium. FIG. 13 illustrates, for example, disk storage 1314. Disk storage 1314 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1314 to the system bus 1308, a removable or non-removable interface is typically used, such as interface 1316. It is appreciated that storage devices 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer system 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices 1336 like monitors, speakers, and printers, among other output devices 1336, which require special adapters. The output adapters 1334 include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1344 refers to the hardware/software employed to connect the network interface 1342 to the bus 1308. While communication connection 1344 is shown for illustrative clarity inside computer 1302, it can also be external to computer 1302. The hardware/ software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

Some representative embodiments may include a method for a memory device, comprising: receiving, by a memory device comprising a controller, a read command comprising an instruction to read data from a memory array comprising a multi-level cell (MLC) characterized by measurable states of the MLC representing multiple bits of information; receiving, by the memory device, the data and associated parity data from the memory array; separating, by the memory device, the data into codewords associated with an error-correcting code (ECC), wherein a first codeword of the codewords comprises a first bit of the multiple bits and a second codeword of the codewords comprises a second bit of the multiple bits; and providing, by the memory controller, the codewords and associated parity data to a decoder associated with the ECC.

Some embodiments may include separating the data into a defined number of codewords determined based on a count of the multiple bits. Some embodiments may include determining an error included in a portion of the codewords and correcting an associated portion of the data. Some embodiments may include transmitting the data to a host associated with the read command.

Other representative embodiments may include a method for a memory device, comprising: receiving, by the memory device comprising a controller, a write command comprising data and an instruction to write the data to a memory array comprising a multi-level cell (MLC) characterized by measurable states of the MLC representing multiple bits of information; generating, by the memory device, parity data for the data that comprises an error-correcting code (ECC); and generating, by the memory device, split data, wherein a first portion of the split data comprises a first bit of the multiple bits and a second portion of the split data comprises a second bit of the multiple bits.

Some embodiments may include generating the split data comprises separating the data into a defined number of portions, including the first portion and the second portion, determined based on a count of the multiple bits. Some embodiments may include writing, by the memory device, the split data and the parity data to the memory array.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
an array of two-terminal memory cells comprising a plurality of multi-level cells (MLCs), wherein each MLC from the plurality of MLCs is characterized by a set of distinct states representing multiple bits of information;
a program and erase voltage generation (PEVG) component, coupled to the array of two-terminal memory cells, that applies to an MLC of the plurality of MLCs a first voltage pulse, and that applies a sensing pulse to the MLC, wherein the first voltage pulse has a first polarity, a first magnitude characterized as a target voltage magnitude, and a first duration characterized as a time over which the first voltage pulse has the first magnitude, and wherein the first voltage pulse is configured to set the MLC to a designated state from the set of distinct states; and a verification component, coupled to the PEVG component and to the array of two-terminal memory cells, that receives sensing feedback from the MLC in response to the sensing pulse applied to the MLC, wherein the verification component compares the sensing feedback to threshold data representative of the designated state, wherein the verification component determines a polarity of a second voltage pulse in response to a determination that the sensing feedback does not satisfy the threshold data; and wherein the PEVG component applies to the MLC the second voltage pulse having the first magnitude and the polarity for a second duration that differs from the first duration.

2. The memory device of claim 1, wherein the threshold data relates to an upper threshold and a lower threshold selected from a group consisting essentially of:
a resistance associated with the MLC in the designated state; and
a conductance associated with the MLC in the designated state.

3. The memory device of claim 1, wherein the polarity of the second voltage pulse is selected from a group consisting essentially of: the first polarity and a second polarity that is opposite the first polarity.

4. The memory device of claim 3, wherein the second voltage pulse has a second magnitude that is less than the first magnitude.

5. The memory device of claim 4, wherein the verification component selects the polarity of the second voltage pulse to be the first polarity in response to determining a value of the sensing feedback is less than a lower threshold of the threshold data.

6. The memory device of claim 3, wherein the second voltage pulse has a second magnitude that is greater than the first magnitude.

7. The memory device of claim 6, wherein the verification component determines the sensing feedback does not satisfy the threshold data in response to determining a value of the sensing feedback is greater than the upper threshold.

8. The memory device of claim 7, wherein the verification component selects the polarity of the second voltage pulse to be the second polarity opposite the first polarity in response to determining the value of the sensing feedback is greater than the upper threshold of the threshold data.

9. The memory device of claim 1, wherein the PEVG component applies to the MLC a third voltage pulse having a second polarity that differs from the polarity of the second voltage pulse.

10. The memory device of claim 1, wherein the MLC is a resistive two-terminal memory cell.

11. The memory device of claim 1, wherein the first voltage pulse or the second voltage pulse is applied via one of: a bitline, a wordline, or both the bitline and the wordline.

12. A memory device, comprising:
an array of two-terminal memory cells comprising a plurality of multi-level cells (MLCs), wherein each MLC from the plurality of MLCs is characterized by a set of distinct states representing multiple bits of information;
a program and erase voltage generation (PEVG) component, coupled to the array of two-terminal memory cells, that applies to an MLC from the plurality of MLCs a first voltage pulse and a sensing pulse, wherein the first voltage pulse has a first polarity, a first magnitude characterized as a target voltage magnitude, and a first duration characterized as a time over which the first voltage pulse has the first magnitude, and wherein the first voltage pulse is configured to set the MLC to a selected state from the set of distinct states; and a verification component, coupled to the PEVG component and to the array of two-terminal memory cells, that receives sensing feedback from the MLC in response to the sensing pulse applied to the MLC, compares the sensing feedback to threshold data representative of the selected state, and determines a polarity of a second voltage pulse in response to a determination that the sensing feedback does not satisfy the threshold data; and wherein the PEVG component applies to the MLC the second voltage pulse having the polarity, the first duration, and a second magnitude that differs from the first magnitude.

13. The memory device of claim 12, wherein the threshold data relates to one of a resistance associated with the MLC in the selected state or a conductance associated with the MLC in the selected state.

14. The memory device of claim 12, wherein the threshold data corresponds to a lowest acceptable resistance value associated with the MLC in the selected state.

15. The memory device of claim 14, wherein the verification component determines the sensing feedback does not satisfy the threshold data based on a determination that a resistance value of the sensing feedback is less than the lowest acceptable resistance value.

16. The memory device of claim 15, wherein the second voltage pulse is asserted for a second duration that is less than the first duration.

17. The memory device of claim 12, wherein the threshold data corresponds to a highest acceptable resistance value associated with the MLC in the selected state.

18. The memory device of claim 17, wherein the verification component determines the sensing feedback does not satisfy the threshold data based on a determination that a resistance value of the sensing feedback is more than the highest acceptable resistance value.

19. The memory device of claim 18, wherein the second voltage pulse is asserted for a second duration that is less than the first duration.

20. The memory device of claim 18, wherein the second voltage pulse has a second polarity that differs from the polarity of the first voltage pulse.

21. The memory device of claim 12, wherein the MLC is a resistive two-terminal memory cell.

22. A method, comprising:
applying, by a controller of a memory device, a first voltage pulse to a multi-level cell (MLC) of a plurality of two-terminal memory cells to set the MLC to a first state, wherein the first state represents multiple bits of information and is one of a set of distinct supported by the MLC, and wherein the first voltage pulse has a first polarity, has a first magnitude characterized as a target voltage magnitude and is applied for a first period characterized as a time during which the first voltage pulse has the first magnitude;
applying, to the MLC, a sensing pulse;
receiving, by the controller, sensing feedback comprising electrical characteristic data for the MLC in response to the sensing pulse;

comparing, by the controller, the sensing feedback to threshold data representative of a first electrical characteristic threshold for the MLC in the first state;

in response to the comparing, determining, by the controller, the sensing feedback does not meet the threshold data;

in response to the determining the sensing feedback does not meet the threshold data, determining a refinement polarity for a second voltage pulse; and applying, to the MLC, the second voltage pulse to set the MLC to the first state, wherein the second voltage pulse has the refinement polarity and is applied for the first period and has a second magnitude that is smaller than the first magnitude or is applied for a second period that is shorter than the first period and is characterized as a time during which the second voltage pulse has the first magnitude.

23. The method of claim 22, wherein the determining the sensing feedback does not meet the threshold data comprises determining that a resistance value included in the sensing feedback is below a first resistance value included in the threshold data.

24. The method of claim 23, wherein the applying the second voltage pulse comprises applying the second voltage pulse with the second magnitude that is smaller than the first magnitude.

25. The method of claim 22, wherein the determining the sensing feedback does not meet the threshold data comprises determining that a resistance value included in the sensing feedback is larger than a first resistance value included in the threshold data.

26. The method of claim 25, wherein the refinement polarity differs from the first polarity of the first voltage pulse.

27. The method of claim 25, wherein the applying the second voltage pulse comprises applying the second voltage pulse for the second period that is shorter than the first period.

* * * * *